United States Patent [19]
Lin

[11] Patent Number: 5,450,414
[45] Date of Patent: Sep. 12, 1995

[54] PARTIAL-SCAN BUILT-IN SELF-TESTING CIRCUIT HAVING IMPROVED TESTABILITY

[75] Inventor: Chih-Jen Lin, Lawrenceville, N.J.
[73] Assignee: AT&T Corp., Murray Hill, N.J.
[21] Appl. No.: 63,191
[22] Filed: May 17, 1993
[51] Int. Cl.⁶ ............................................. G06F 11/00
[52] U.S. Cl. ..................... 371/22.3; 371/22.1; 371/25.1; 371/27; 324/158.1
[58] Field of Search ................ 371/22.3, 23, 22.1, 371/25.1, 27; 324/158 R, 73.1, 158 P, 158 F; 29/825, 846, 832

[56] References Cited

U.S. PATENT DOCUMENTS

| | | | |
|---|---|---|---|
| 4,225,957 | 9/1980 | Doty, Jr. et al. | 371/22.3 |
| 4,366,393 | 12/1982 | Kasuya | 371/22.3 |
| 4,534,028 | 8/1985 | Trischler | 371/22.3 |
| 5,043,986 | 8/1991 | Agrawal | 371/25.1 |
| 5,103,557 | 4/1992 | Leedy | 29/832 |
| 5,132,974 | 7/1992 | Rosales | 371/22.3 |
| 5,291,495 | 3/1994 | Udell, Jr. | 371/22.3 |
| 5,305,328 | 4/1994 | Motohara et al. | 371/27 |

OTHER PUBLICATIONS

Gupta et al, "Testability Properties of Acyclic Structures and Applications to Partial Scan Design", IEEE VLSI Test Symposium 1992, paper 2.4, pp. 49–54.
P. H. Bardell, W. H. McAnney, and J. Savir, Built–In Test for VLSI: Pseudorandom Techniques, Wiley Interscience 1987), pp. 241–242.
F. Brglez, P. Pownall, and R. Hum, "Applications of Testability Analysis: from ATPG to Critical Delay Path Trading," Proc.Int'l.Test Conf., pp. 705–712, 1984.
C.-J. Lin, Y. Zorian, and S. Bhawmik, "PSBIST: A Partial–Scan Based Built–In Self Test Scheme," International Test Conference Proceedings 1993, 1 Jan. 1993, pp. 507–516.
M. Youssef, Y. Savaria, and B. Kamiska, "Methodology for Efficiently Inserting and Condensing Test Points," IEE Proceedings–E Computers & Digital Techniques, vol. 140, No. 3, May 1993, Stevenage GB, pp. 154–160.
J. Steensma, W. Guerts, F. Catthoor, and H. de Man, "Testability Analysis in High Level Data Path Synthesis," Journal of Electronic Testing, vol. 4, No. 1, Feb. 1993, Dordrecht NL, pp. 43–56.
H.–J. Wunderlich and S. Hellebrand, "The Pseudoexhaustive Test of Sequential Circuits," IEEE Transactions on Computer Aided Design of Integrated Circuits and Systems, vol. 11, No. 1, Jan. 1992, New York US, pp. 26–33.
B. Escherman and H.–J. Wunderlich, "Optimized Synthesis of Self-Testable Finite State Machines," Fault-Tolerant Computing: 20th International Symposium, 26–28 Jun. 1990, Digest of Papers, IEEE, Los Alamitos US, pp. 390–397.

Primary Examiner—Emanuel T. Voeltz
Assistant Examiner—Alan Tran
Attorney, Agent, or Firm—Robert B. Levy

[57] ABSTRACT

The testability of a near-acyclic circuit (14) can be enhanced by the addition of one or more control points (36) and observation points (34) to allow for increased observability and controllability of selected nodes (28). The control points (36) and/or test points (34) are added by first computing the controllability, observability and fault detection probability at each node. A fault is then selected. If either the controllability or observability for such fault is not inside a prescribed value range, and the fault detection probability is below a prescribed value, then either a control point (36) and/or a observation point (34) may be added.

14 Claims, 4 Drawing Sheets

PARTIAL-SCAN BUILT-IN SELF-TESTING CIRCUIT HAVING IMPROVED TESTABILITY

TECHNICAL FIELD

This invention relates to an electronic circuit having improved testability by virtue of the inclusion of at least one additional test point at a selected node in the circuit.

BACKGROUND OF THE INVENTION

The advent of miniaturization has led to ever denser electronic circuits. As the density of electronic circuits has increased, so too has the complexity and cost of testing. In an effort to reduce the cost and complexity of testing digital integrated circuits and, particularly, random logic digital circuits, various techniques such as partial-scan testing have been developed. Partial-scan testing, as described in U.S. Pat. No. 5,034,986, issued on Aug. 27, 1991, in the names of V. Agrawal et al., and assigned to the present assignee (incorporated by reference herein), is practiced by partitioning the circuit such that selected sequential elements (i.e., flip-flops) in the circuit are arranged as a shift register. Initially, the circuit is placed in a test mode and a known stream of test data is shifted into the shift register configured of the selected flip-flops, usually referred to as "scan" flip-flops. Thereafter, the integrated circuit is placed in its normal operating mode so as to react to the test data. Finally, the integrated circuit is returned to the test mode and the test data (as modified by the operation of the integrated circuit) is shifted out from the scan flip-flops for comparison to a reference data stream.

Partial scan testing may be improved, in the manner taught in my copending U.S. patent application, Ser. No. 813,521, "Partial Scan Built-In Self-Test Technique", filed Dec. 26, 1991, and assigned to the present assignee (incorporated by reference herein). As described in my co-pending application Ser. No. 813,521, such testing of an integrated circuit may be improved by the addition of built-in, self-test circuitry, including a test pattern generator and a compactor. Self-looping, non-scan flip-flops in the circuit are replaced with initializable flip-flops so that the integrated circuit can be set to an initial state prior to testing to obtain a deterministic signature.

While my partial-scan, built-in, self-test circuit achieves very high fault coverage (that is, the circuit can self-detect a high percentage of faults), there is a need to increase the level of fault coverage even higher. One traditional approach to increasing the level of fault coverage in built-in, self-test circuits has been to add "test points" at various nodes in the circuit. For purposes of discussion, a test point is defined as being either an observability point (i.e., a line coupled to a circuit node to facilitate observation of the signal at that node) or a control point, (i.e., either an AND or OR gate inserted between the node, and a line supplying the node with signals). Placement of test points in a built-in, self-test circuit presents little difficulty when the circuit is comprised purely of combinational elements (i.e, AND, OR, NAND, NOR, NOT and XOR gates). For such combinational circuits, test points can be selected using a known procedure for calculating a probabilistic measure of the controllability and observability of the nodes in the circuit. The controllability of a node is defined as the ability to excite a fault (e.g., a stuck-at-1 or a stuck-at-0 fault), whereas the observability of a node is defined as the ability to observe the effect of a fault at the node.

In contrast, placement of test points in a sequential circuit (i.e., a circuit containing one or more flip-flops) is a far more difficult problem, especially because the controllability-observability probabilistic calculations employed for test point determination in combinational circuits have traditionally been deemed inapplicable for sequential circuits. One current approach to adding test points in a sequential circuit is to perform fault simulation to determine optimal test point placement. Fault simulation is time consuming and quickly becomes impractical for even moderately large sequential circuits.

The non-scan portion of the partial-scan, built-in, self-test circuit described in my co-pending application Ser. No. 813,521 is a special type of sequential circuit, known as a near-acyclic circuit. A near-acyclic circuit is a synchronous sequential circuit (i.e., one which contains one or more flip-flops) having a corresponding directed graph which does not contain any cycle whose length is greater than one. Thus, in a near-acyclic circuit, there exist no flip-flop loops (a sequential chain of two or more flip-flops with the output of the last one in the chain being fed back to the input of the first flip-flop). An acyclic circuit may however contain one or more "self-looping" flip-flops, (i.e., a single flip-flop whose input is fed back to its output).

Thus, there is a need for a technique for enhancing the testability of a near-acyclic circuits by adding test points to such a circuit in an efficient manner.

SUMMARY OF THE INVENTION

Briefly, in accordance with the invention, there is provided a technique for enhancing the testability of a near-acyclic circuit by adding at least one test point thereto. The method of the invention is practiced by first modeling (i.e., decomposing) the circuit into circuit blocks represented by self-looping flip-flop blocks and primary output blocks, each block including at least one gate having at least one node. Once the circuit has been modelled in this manner, the controllability, observability and fault detection probability of each node is calculated. Thereafter, a fault is selected (e.g., a stuck-at-1 or a stuck-at-0 fault) for a node of interest. If the node has a controllability, observability and detection probability not inside a prescribed value range for each value, a test point is added. The test point may take the form of an observation point (i.e., a signal line coupled to the node) or a control point (i.e., a gate such as an AND or OR gate). The steps of: (1) computing the controllability, observability and fault detection probability for each node; (2) selecting a fault associated with a particular node; and (3) inserting a test point if the controllability, observability and fault detection probability are not inside a prescribed range for each value are repeated until the fault coverage does not significantly increase, or until no more of the nodes can be selected.

In accordance with another aspect of the invention, there is provided a partial-scan, built-in, self-test circuit having improved testability. The circuit is comprised of a portion having a near-acyclic structure with at least one node therein. A test pattern generator is coupled to this circuit portion for supplying successive test patterns thereto, each test pattern causing the circuit portion to generate a response indicative of its operation. A compactor is coupled to the circuit portion for compacting the responses. The partial-scan, built-in, self-test circuit of the invention is characterized by at least one additional test point within its near-acyclic circuit portion to improve its testability (i.e., the fault coverage). The test point is added to a node in the network such that the node has a controllability, observability and detection probability below a prescribed value therefor prior to the addition of the test point and that the addition of the test point increases the fault coverage of the circuit.

DETAILED DESCRIPTION

Figure 1:
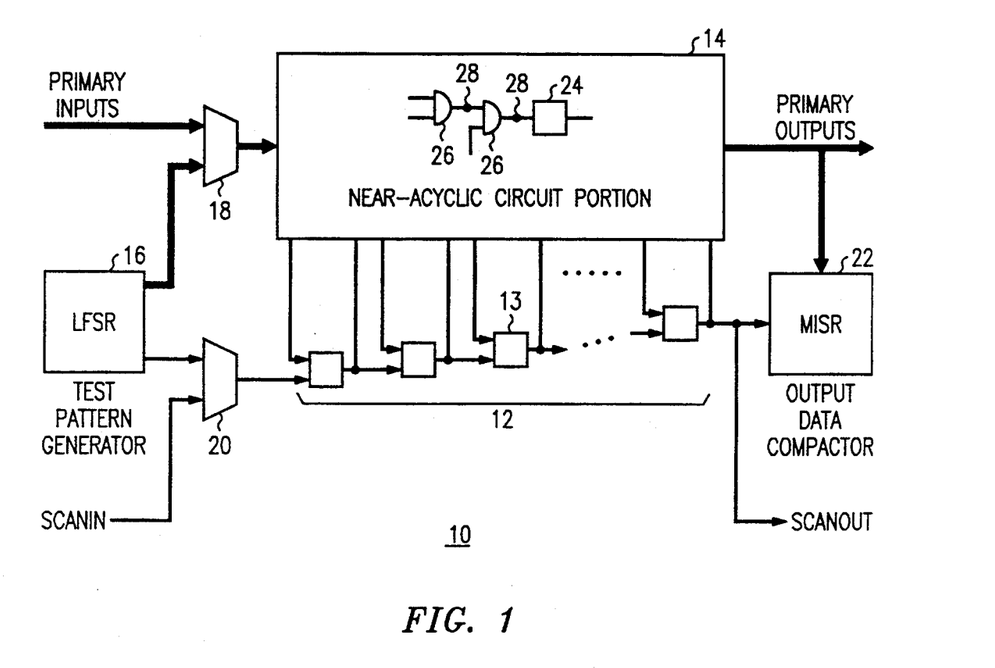
FIG. 1 is a block schematic diagram of a partial-scan, built-in, self-test circuit.
Figure 2:
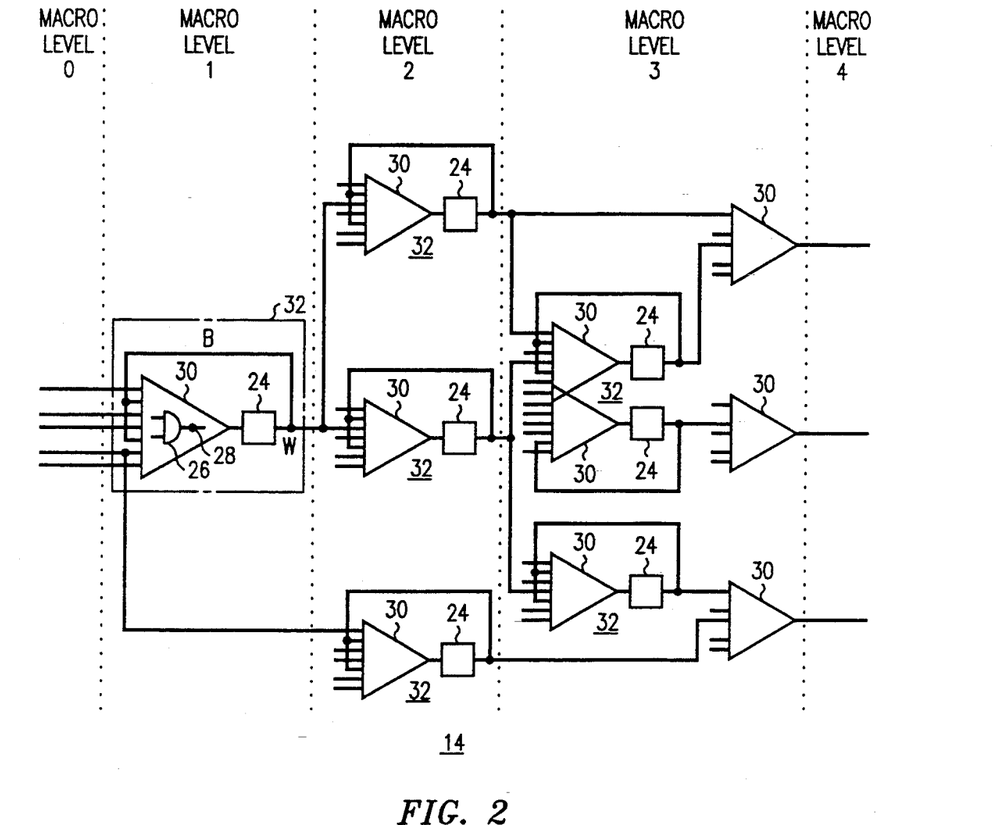
FIG. 2 is a block schematic diagram of a portion of the circuit of FIG. 1 following decomposition.

FIG. 1 illustrates a partial-scan, built-in, self-test circuit 10 which has been partitioned into a partial-scan chain 12, comprised of a plurality of individual flip-flops 13 coupled to form a shift register, and a near-acyclic, non-scan chain circuit portion 14, whose details are described in greater detail with respect to FIG. 2. The partial-scan chain 12 is similar to the scan chain described in the aforementioned Agrawal et al. U.S. Pat. No. 5,043,986 (incorporated by reference herein) and is tested by the technique of partial-scan testing as described in that patent.

To accomplish built-in self-testing of both the scan chain 12, as well as the circuit portion 14, the system 10 includes a test pattern generator 16 in the form of a Linear Feedback Shift Register (LFSR) that generates a sequence of random test patterns (i.e., a plurality of successive sets of test vectors). The test patterns from the LSFR 16 are multiplexed by a set of multiplexers 18 with one or more primary input signals (i.e., normal operating mode signals) generated externally and intended for input to the circuit 14 (including the scan chain 12). The output of the multiplexer 18 is coupled to the circuit 14. Test patterns from the LSFR 16 are multiplexed by a second multiplexer 20 with an input signal SCANIN received by the system 10. The output of the multiplexer 20 is coupled to the first of the flip-flops 13 in the scan chain 12, and in response to the signal from the multiplexer, the scan chain produces an output signal SCANOUT.

The output of the scan chain 12 is also coupled to a Multiple Input Shift Register (MISR) 22 which serves to successively compact the output signal of the scan chain with the output signal generated during a previous interval. The MISR 20 also serves to compact output data generated by the circuit 14 with the output data generated previously by the circuit. The MISR 20 compacts the output signals from the scan chain 12 and from the circuit 14 to yield a bit stream referred to as a "signature" which is descriptive of the operation of the system 10. By comparing the signature of the system 10 to that for a fault-free system, the existence or absence of defects will be revealed.

As will be discussed in greater detail with respect to FIG. 2, the circuit portion 14 is typically comprised of one or more sequential elements 24 (i.e., flip-flops) and one or more combinational elements 26 (i.e., gates), the elements being joined so as to create at least one node 28. The exact nature of the elements 24 and 26 and the manner in which they are coupled is dependent on the functions to be performed by the system 10. The manner in which the elements 24 and 26 are coupled is not relevant to the invention, except that the circuit 14 has no flip-flop loops other than self-loops, as will be explained in greater detail later.

While the partial-scan, built-in, self-test system 10, when configured as described, will typically have a very high fault coverage (i.e., the percentage of faults that the system can detect), it is often desirable to increase the fault coverage. One method for increasing the level of the fault coverage is selectively adding one or more "test points" within the circuit portion 14. A test point may consist of either an "observation point" (i.e., a line coupled to one of the nodes 28 so as to allow the signal at the node to be observed) or a "control point" (i.e., either an AND or OR gate (not shown) interposed between the node and the signal driving it to allow the signal at the node to be controlled). In the past, the addition of test points within a network, such as the network 14, has typically been accomplished by means of fault simulation, often a very slow process.

In accordance with my invention, there is disclosed a method for enhancing the testability of a special class of sequential circuits, known as near-acyclic circuits, which are defined as having a corresponding directed graph which does not contain any cycle whose length is greater than one. Thus, the circuit portion 14 is a near-acyclic circuit because it contains no flip-flop loops (i.e., the circuit portion does not contain two or more daisy-chained flip-flops 24). However, the circuit portion 14 may contain one or more self-looping flip-flops 24 which have their output coupled directly to their input and still be considered a near-acyclic circuit. (In accordance with my co-pending patent application Ser. No. 813,521 (herein incorporated by reference) such self-looping flip-flops would be replaced with initializable flip-flops for testing purposes.)

Testing of the circuit 10 is enhanced, in accordance with my invention, by the appropriate insertion at least one test point in the circuit portion 14 using a probabilistic measure of testability described in greater below. In order to accomplish a probabilistic measure of testability of the 10, the circuit portion 14 is first decomposed (modelled) in order to simplify the probabilistic calculations. Referring to FIG. 2, the circuit portion 14 may be modelled by grouping the combinational elements 26 and non-self-looping flip-flips 24 into logic cones 30, which have one or more inputs and no more that one output. (A self-looping flip-flop 24 is defined as a flip-flop which has its output coupled to its input, either directly, or through one or more gates 26). Each logic cone 30 whose output serves as a primary output of the circuit 14 (such as each of the logic cones located at the right-hand side of FIG. 2) is designated as a primary output block.

For each flip-flop 24 which is self-looping, the combination of the flip-flop and a logic cone 30 whose output is an input to the flip-flop, is modelled as a self-loop flip-flop block 32. As seen in FIG. 2, a self-loop flip-flop block 32 may contain two or more overlapping logic cones 30 (i.e., the cones may share common inputs), each cone having an associated flip-flop 24. However, only one flip-flop 24 within such a block 32 may have its output coupled to the overlapping (i.e., common) inputs. Otherwise, the circuit portion 14 would no be a near-acyclic circuit.

CONTROLLABILITY CALCULATION

Once the circuit 14 has been decomposed in this fashion, then the controllability of each node 28, representing the output of a corresponding gate 26 in FIG. 2, is determined. The controllability of a node 28 (expressed by the term C(28)) is defined as the probability of effecting a certain signal value at that node. For purposes of discussion, the controllability will be defined as the probability of effecting a logic "1" at a node. In the case where the gate 26 is a two-input AND gate, the controllability of the node 28 (the output of the gate 26) may be expressed mathematically as:

$$C(28) = C(a)*C(b) \quad (1)$$

where C(a) and C(b) are the controllability of the signals at each of the AND gate inputs (a) and (b), respectively.

In the case where the gate 26 comprises a two-input OR gate (not shown) rather than an AND gate, then the controllability of the node 28 is given by the relationship:

$$C(28) = 1 - [(1 - C(a))*(1 - C(b))] \quad (2)$$

For a single-input NOT gate (not shown), the controllability is given by $$C(28) = 1 - C(a) \quad (3)$$

where C(a) is the controllability of the input to the NOT gate. The controllability for a two-input NAND gate (not shown) may be calculated by treating the gate as the serial combination of an AND gate and a NOT gate whose controllabilities are given by equations (1) and (3), respectively. The controllability of a NOR gate (not shown) may be computed in a similar fashion.

As may be appreciated, computing the controllabilities in this fashion is an iterative process which is commenced by first calculating the controllability for each node 28 associated with each gate 26 whose input forms a primary input to the circuit 14, the primary inputs being those inputs at the left-hand edge of FIG. 2. Thus, the controllability computation would be commenced on those gates 26 closest to the left-hand edge of the drawing. For each such gate 26 whose input serves as a primary input, the controllability at that input (i.e., the probability of obtaining a prescribed logic value) is accorded the value 0.5, indicating that it is equally likely to get a logic "1" for example as a logic "0".

Computing the controllability of each flip-flop 24 is a more complex task than for each combinational gate 26, owing to the memory-like nature of the flip-flop. However, the task of computing the controllability of each flip-flop 24 can be simplified by modelling each non-self-loop flip-flop simply as a short-circuit between its D and Q outputs without regard to the clock input. While this approximation introduces some inaccuracy, the computation is greatly simplified.

By approximating each flip-flop 24 as a short circuit, the controllability C(W) of a node 28 at the Q output of a self-loop flip-flop is given mathematically by $$C(W) = C(0)/(1 - C(1) + C(0)) \quad (4)$$

where C(0) is the controllability at the flip-flop D input after assigning a 0 controllability to the Q output and disconnecting the Q output from that of the block 32, and C(1) is the controllability at the flip-flop D input after assigning a probability of 1 at the Q flip-flop output. In computing C(0) and C(1), the statistical dependence among controllabilities of reconvergent fanout branches is ignored and the above-described controllability calculation technique for combinational gates is used.

Using the approximation discussed above, the controllability of each node in each self-loop flip-flop block 32 is calculated using the following procedure:

1. Assign a controllability value of 0 to the Q output of the self-loop flip-flop 24 in the self-loop flip-flop block, and using the techniques discussed above, compute the controllability of all nodes 28 in the logic cone 30 associated with the block, including the controllability of the D input of the self-loop flip-flop whose controllability is C(0);

2. Assign a controllability value of 1 to the Q output of the self-loop flip-flop 24 in the self-loop flip-flop block 32 and update the controllabilities of each "private" node 28 to reflect the controllability change at the Q flip-flop output, with the new controllability at the D flip-flop input being C(1); (A node 28 is deemed "private" if it lies in a path between the self-loop flip-flop 24 and an input of a gate 26 inside the self-loop flip-flop block 32 and connected to the output of the flip-flop.)

3. Assign the value of C(0)/(1−C(1)+C(0)) as the controllability of the Q output of the self-loop flip-flop 24 and update the controllability of all private nodes 28 to reflect the change.

In both steps (1) and (2), only the controllabilities of those nodes 28 of the associated logic cones 30 are computed. During step (3), however, the effect of the change in the controllabilities is propagated outside the associated logic cone 30.

OBSERVABILITY CALCULATION

Once the controllability of each node 28 has been computed, then each node's observability is computed. The observability of each node 28 (expressed by the term O(28)) is defined as the probability that a fault present at that node can be observed through one of the primary outputs of the circuit 14. For example, the controllability of a node 28, representing one input of a two-input AND gate 26, may be expressed mathematically by the relationship:

$$O(28) = O(\text{output})*C(a) \quad (5)$$

where O(output) is the observability of the output of the AND gate and C(a) is the controllability of the other AND gate input.

In the case where the gate 26 is an OR gate rather than an AND gate, the observability of the node 28, representing one of the OR gate inputs, is given by the expression:

$$O(28) = O(\text{output})*(1 - C(a)) \quad (6)$$

The observability at the output of a NOT gate (not shown) is the same as that of its input. Computation of the observability of each node 28 is accomplished in a manner similar to the manner in which the controllability of each node is performed, except that the observability computation is done from the primary circuit outputs (i.e., from the right-hand side of FIG. 2) to the primary circuit inputs (i.e., the left-hand side of the figure). The computation of the observability of each node 28 within each self-loop flip-flop block 32 requires a slightly different procedure from that described for computing the controllability of each node in the block. To compute the observability of each node 28 in each block 32, the following steps are executed:

1. Assign O(W), the observability at the output of the self-loop flip-flop block 32, to the O(Q), the observability of the Q output of the self-loop flip-flop 24 in the block, if there exists a branch W (see FIG. 2) which links the block somewhere else; otherwise assign zero to O(Q);

2. Assign O(Q) to O(D), the observability of the D input of the self-loop flip-flop 24 in the block 32;

3. Compute only the observabilities of the private nodes in the block from the self-loop flip-flop D input on back, using the technique described previously until O(B), the observability along a feedback loop B in the block is computed;

4. Calculate the O(Q) using the relationship:

$$O(Q) = 1 - [(1 - O(B)) * (1 - O(W))] \quad (7)$$

5. If $O(Q) - O(D)/(O(D)) > x\%$ (where x is a threshold percentage, typically between 3 and 5) then go to step (2); otherwise 6. Assign O(Q) to O(D); and 7. Compute the observability of all of the nodes 28 in the cone 30 of self-loop flip-flop block 32. Steps (2) through (5) are repeated until the percentage difference between the two consecutive values of O(Q) is smaller than the threshold percentage x.

The controllability and observability of each node 28 calculated in the manner described above are collectively referred to as the Station State Controllability Observability Measure (SSCOM).

DETECTION PROBABILITY

After the controllability and observability (i.e., the SSCOM) of each node 28 are calculated, then the detection probability $dp_f$ for a fault f (e.g., a stuck-at-1 or stuck-at-0 fault) at a given node 28 is computed by the following relationships:

$$dp_f = C(28) * O(28) \quad (8)$$

if the fault is a stuck-at-zero fault; otherwise $$dp_f = (1 - C(28)) * O(28) \quad (9)$$

if the fault is a stuck-at-1 fault.

The detection probability $dp_f(t)$ of a fault f for t random patterns is given by the relationship:

$$dp_f(t) = 1 - (1 - dp_f)^t \quad (10)$$

The fault coverage fc(t) (i.e., the percentage of faults that can be detected) can be expressed by the following relationship:

$$fc(t) = (1/|F|) * \Sigma dp_f(t) \quad (11)$$

where summation is for all faults in the fault set F and |F| is the fault size.

TEST POINT INSERTION

Figure 3:
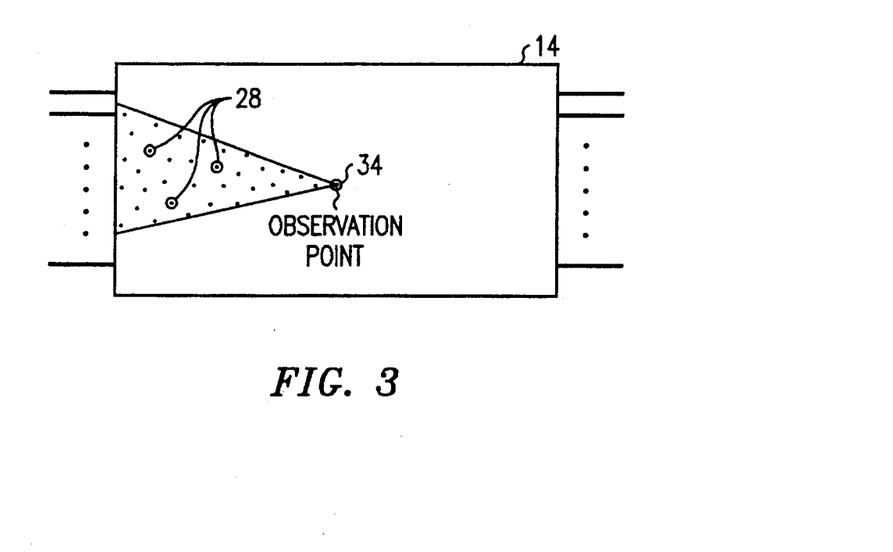
FIG. 3 shows a region of the portion of the circuit of FIG. 1 influenced by an observation point.
Figure 6:
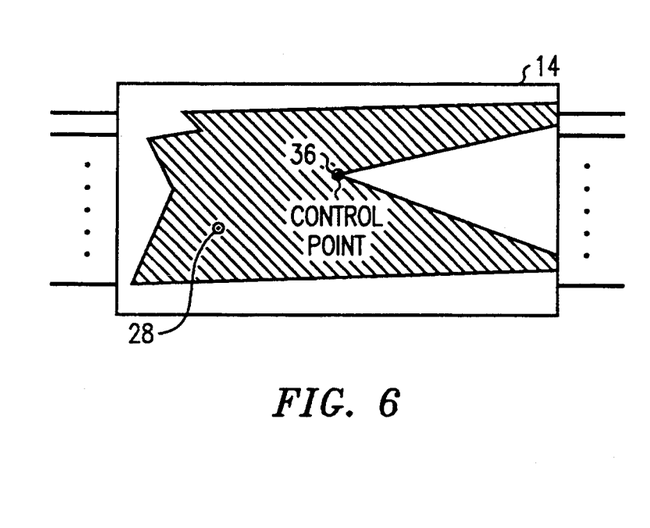
FIG. 6 shows a portion of the circuit of FIG. 2 which is influenced by a control point.

The testability of the circuit 10, and particularly, the testability of the circuit portion 14, may be enhanced by adding a test point, either in the form of an observation point 34, as seen in FIG. 3, or a control point 36, as seen in FIG. 6. An observation point 34 is a point at which the fault at each of a plurality of other nodes can be observed. For example in FIG. 3, the observation point 34 has been selected (in the manner described hereinafter) such that the fault at each of the nodes 28 lying in the shaded region of the circuit 14 can be observed at the observation point.

Figure 4:
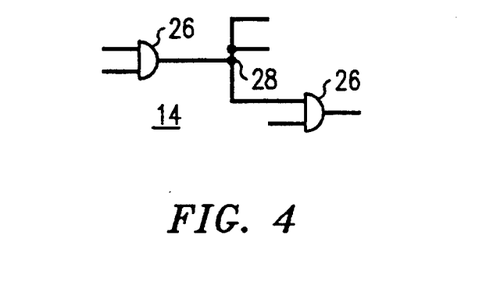
FIG. 4 shows a portion of the circuit of FIG. 2 as it exists before the addition of an observation point.
Figure 5:
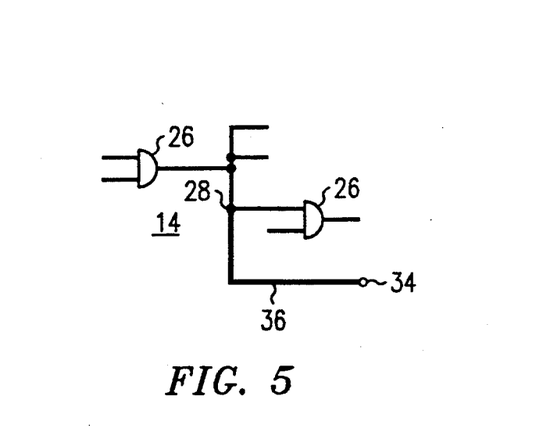
FIG. 5 shows the circuit portion of FIG. 4 following the addition of an observation point.

The exact manner in which each observation point 34 is added is straightforward. Referring to FIG. 4, which illustrates a part of the circuit portion 14, assume that a good location to observe faults is at a node 28 at the junction between a pair of gates 26. Referring to FIG. 5, to provide an observation point 34 associated with the node 28, a line 36 is provided to couple the node to the observation point 34. In practice, each observation point 34 is typically located so as to be physically accessible.

Figure 7:
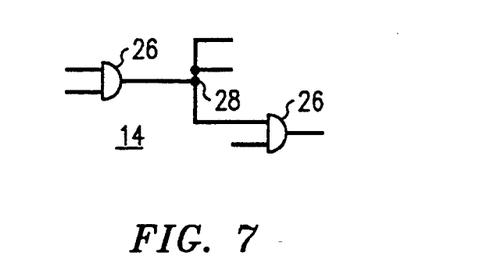
FIG. 7 shows a portion of the circuit of FIG. 2 as it exists before the addition of a control point.
Figure 8:
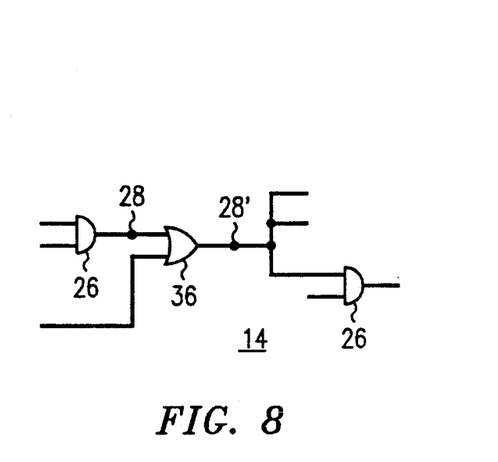
FIG. 8 shows the circuit portion of FIG. 7 following the addition of a control point.

Referring to FIG. 6, a control point 36 is, in actuality, an element (described in greater detail with respect to FIG. 8) which serves to influence the controllability of a plurality of nodes 28 in the circuit. As seen in FIG. 6, the control point 34 has been selected (in the manner described below) to influence the controllability of each of a plurality of nodes 28 lying within the cross-hatched region of the circuit 14. Referring now to FIG. 7, which shows a part of the circuit portion 14, assume that it has been determined that the node 28, at the junction between a pair of gates 26, has been found to desirably influence the controllability of other nodes in the circuit portion 14 (not shown). FIG. 8 depicts the part of the circuit portion 14 shown in FIG. 7 with the addition of a test point 36, in the form of a two-input control logic gate interposed between the gates 26, such that node 28 lies at a first input of the control logic gate and a second node 28' lies at its output. As may be appreciated, the control logic gate 36 of FIG. 8 serves to control the state of the signal at the node 28' in accordance with the signal at the node 28 and in accordance with the signal r at the second input of the control logic gate.

The control logic gate 36, which forms the control point, may either take the form of an OR gate, as seen in FIG. 8, or an AND gate (not shown). The particular structure of the gate 36 depends on the controllability of the node 28. If the controllability of the node 28, as calculated by the SSCOM technique discussed previously, is less than a prescribed value (i.e., <0.5), the gate 36 takes the form of an OR gate. On the other hand, if the controllability at the node 28' is above a prescribed value (i.e., >0.5), the gate 36 is chosen as an AND gate.

TEST POINT SELECTION

As discussed, the goal of adding one or more test points, each taking the form of either an observation point 34 and/or a control point 36, is to increase the level of fault coverage. However, to avoid unnecessarily impacting the circuit 14, it is undesirable to add more test points than are needed to increase the level of fault coverage. In accordance with my invention, the following method is employed to select test points to achieve a desired level of fault coverage during testing of the circuit 14 by the application of t random patterns generated by the test pattern generator 16 of FIG. 1 with the minimum number of test points:

1. Decompose the circuit portion 14, as shown in FIG. 2, into the primary output blocks 30 and self-loop flip-flop blocks 32. In the process of decomposition, the blocks are automatically arranged in increasing order of macro-level. The macro-level, as defined in terms of a node e in a near-acyclic circuit, such as the circuit portion 14, is defined by:

$$ML(e) = 0 \tag{12}$$

if e is a primary input; or $$ML(e) = 1 + \max(ML(k)) \tag{13}$$

for all nodes k that feed node e directly if e is the input to a self-loop flip-flop 24; otherwise $$ML(e) = \max(ML(k)) \tag{14}$$

2. Replace all non-self-loop flip-flops 24 by a short-circuit between the flip-flop D input and Q output.

3. The controllability of the nodes (28) in the circuit portion 14 is computed, a block at a time, from the lowest macro-level (i.e., the blocks at the right-hand-most edge of FIG. 2) toward the highest macro-level (i.e., the block at the right-hand-most edge of FIG. 2).

4. Select the fault f at a designated node 28 such that the fault detection probability for that fault $dp_f < 1/t$ and CC(F) is less than $(1/t)^{h1}$, where CC(f) is equal to C(28), the controllability of the node, if the fault at the node is a stuck-at-0 fault, or $1 - C(28)$ if the fault at the node is a stuck-at-1 fault), and where h1 is a constant in the range of $[\frac{1}{2}, 1]$ (with $\frac{2}{3}$ being a good value). Another criterion is that the node 28 associated with the fault must also have the smallest level vector among the faults satisfying the above conditions.

The level-vector of a node 28 is a two-tuple and is defined as:

$$LV(28) = <ML(28), ml(28)> \tag{15}$$

where ML(28) is the "macro-level" for a node (28) as defined earlier and m1(28) is the node micro-level.

The micro-level m1(28) of a node 28 is given by the relationship:

$$m1(28) = 0 \tag{16}$$

if the node 28 is a primary input, or the output of a self-loop flip-flop 24; or $$m1(28) = 1 + \max(m1(k)) \tag{17}$$

for all of the nodes k that feed the node 28 directly.

5. Once the node 28 has been selected in accordance with the requirements of step (2), the a control point, in the form of gate 36 (see FIG. 6), is added at the node. The gate 36 is chosen to be an AND gate when CC(f) > 0.5 or an OR gate when CC(f) < 0.5.

The steps (3), (4) and (5) are repeated until a desired fault coverage is reached or no more nodes 28 can be selected.

In the event that no more of the nodes 28 can be selected, but the desired level of fault coverage has not been achieved, then the following second procedure is executed:

1. Compute the controllability, observability and detection probability for the faults of the nodes 28 using the SSCOM methods described previously;

2. Select a fault associated with a given node 28 such that $dp_f < 1/t$ and CC(F) is less than $(1/t)^{h2}$, where h2 is a constant in the range of $[\frac{1}{2}, 1]$ (with $\frac{2}{3}$ being a good value), and the node 28 associated with the fault has the largest level vector among those faults satisfying these conditions;

3. Insert an observation point 34 if the fault appears at a node 28 which is at the output of a gate 26, otherwise insert a control point 36 if the fault is associated with a node at an input of a gate. The control point 36 is inserted at a location close to the fault such that the associated node 28 has its observability increased by the greatest amount.

4. Steps (1)–(3) of this second procedure are repeated until the desired level of fault coverage is achieved, or no more nodes 28 can be selected using the criteria of step (2).

The first procedure is intended to better detect hard-to-control faults by the addition of one or more control points 36. The second procedure is intended to detect hard-to-observe faults by the addition of one or more observation points 34. The rationale for adding control points 36 prior to the addition of observation points 34 is that the addition of a control point may in fact increase the observability of one or more nodes without the need to add an observation point 34. Moreover, since the control points 36 are added in ascending level-vector order, the number of such points required is reduced because the insertion of a control point can improve not only the controllability of a given node, but the nodes which are in its fanout cone as well. Note that the observability of a node 28 can be improved by inserting either an observation point 34 or a control point 36.

The foregoing discloses a technique for improving the testability of a near-acyclic circuit 14 by the selective addition of at least one test point, either in the form of a control point 36 and/or an observation point 34 to increase the level of fault coverage.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A digital circuit having an improved ability to be electronically tested by test signals applied thereto comprising:

a sequential network having a near-acyclic structure, the network having at least one node therein at which a fault may occur;

a test pattern generator coupled to the network for supplying successive test patterns thereto to cause the network to generate a response following receipt of each successive pattern;

an electronic logic block coupled to the network for compacting the response generated thereby; and the digital circuit being characterized by at least one test point added within the sequential network to improve the testability thereof, the test point being added at a node selected such that the node has a separate one of its controllability and observability probabilities different from a prescribed value therefor and a detection probability below a prescribed value therefor prior to the addition of the test point, and insertion of the mode increases fault coverage during testing.

2. The circuit according to claim 1 wherein the test point comprises an observation point.

3. The circuit according to claim 1 wherein the test point comprises a control point.

4. The circuit according to claim 3 wherein the control point comprises an OR gate when the selected node has a controllability below a prescribed value.

5. The circuit according to claim 3 wherein the control point comprises an AND gate when the selected node has a controllability above a prescribed value.

6. A method for modifying a near-acyclic circuit to improve its testability by adding at least one test point thereto to increase the level of fault coverage when the circuit is tested by applying a successive one of t random test patterns thereto, comprising the steps of:
 (a) computing the controllability, observability and detection probabilities of each node in the circuit;
 (b) selecting a fault for a given one of the nodes;
 (c) adding a test point at a particular node when a separate one of the controllability and observability probabilities for the node is not within a prescribed value range for each value therefor and the detection probability is below a prescribed value therefor; and
 (d) repeating the steps of (a)–(c) until either the fault coverage no longer increases or until no more faults can be selected.

7. The method according to 6 wherein the test point which is added comprises an observation point.

8. The method according to claim 6 wherein the test point which is added comprises a control point.

9. The method according to claim 8 wherein the control point comprises an AND gate when the controllability of the node at which the control is to be added is above a prescribed value.

10. The method according to claim 8 wherein the control point comprises an OR gate when the controllability of the node at which the control is to be added is below a prescribed value.

11. The method according to claim 6 wherein only control points are added as long as no more faults can be selected and thereafter repeating steps (a)–(c), wherein either control points or observation points are added.

12. The method according to claim 6 wherein the controllability of each node in the circuit is computed by the steps of:
 (a) decomposing the circuit into serf-loop flip-flop blocks, each containing a self-looping flip-flop and primary output blocks containing no self-looping flip-flops;
 (b) replace each non-self-loop flip-flop with a short circuit;
 (c) computing the controllability of each self-loop flip-flop block from a lower macro-level toward a higher macro-level, one block at a time, by the steps of:
  (i) assigning a controllability value to the Q output of the self-looping flip-flop in the block to zero and then computing the controllability of all nodes in the block, including the controllability (C(0)) of the corresponding flip-flop D input;
  (ii) assigning a controllability value of one to the Q outputs of the self-looping flip-flop and then updating the controllability of each node lying in the path of the self-looping flip-flop and an input of a gate in the block connected to the output of the self-looping flip-flop to reflect the controllability change at the self-looping flip-flop Q output, with the new controllability at the self-looping flip-flop D input now being C(1);
  (iii) assigning the value of $C(0)/(1-C(1)+C(0))$ to the controllability of the Q output of the self looping flip-flop and then updating the controllabilities of said nodes lying in the path of the self-looping flip-flop and an input of a gate in the block connected to the output of the self-looping flip-flop; and
 (d) computing the controllability of each primary output block from a lower macro-level to a higher macro-level, one block at a time.

13. The method according to claim 6 wherein the observability of each node in the circuit is computed by the steps of:
 (a) decomposing the circuit into self-loop flip-flop blocks, each containing a self-looping flip-flop and primary output blocks containing no self-looping flip-flops; and
 (b) computing the observability of each primary output block;
 (c) computing the observability of each self-loop flip-flop block by the steps of:
  (i) Assign O(W), the observability of each self-loop flip-flop block, to the O(Q), the observability of the Q output of the self-loop flip-flop in the block if there exists a branch W which link the block somewhere else; otherwise assign zero to O(Q);
  (ii) Assign O(Q) to O(D), the observability of the D input of the self-loop flip-flop in the block 32;
  (iii) Compute only the observabilities of each node lying in the path of the self-looping flip-flop and an input of a gate in the block connected to the output of the self-looping flip-flop in the block from the self-loop flip-flop D input back to each preceding node, until O(B), the observability along a feedback loop B in the block is computed;
  (iv) Calculate the O(Q) using the relationship:

$$O(Q)=1-[(1-O(B))*(1-O(W))]$$

(v) Calculate if $O(Q)-O(D)/(O(D)) >$ a prescribed % then repeat step (ii); otherwise
  (vi) Assign O(Q) to O(D); and
  (vii) Compute the observability of all of the nodes in the self-loop flip-flop.

14. The method to claim 6 wherein the detection probability for a fault at a node is computed in accordance with the controllability and observability for that node.

* * * * *